United States Patent
Kawaji et al.

(10) Patent No.: US 7,992,318 B2
(45) Date of Patent: Aug. 9, 2011

(54) HEATING APPARATUS, HEATING METHOD, AND COMPUTER READABLE STORAGE MEDIUM

(75) Inventors: Tatsuya Kawaji, Koshi (JP); Yuichi Sakai, Koshi (JP); Masatoshi Kaneda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 461 days.

(21) Appl. No.: 12/007,975

(22) Filed: Jan. 17, 2008

(65) Prior Publication Data
US 2008/0175999 A1 Jul. 24, 2008

(30) Foreign Application Priority Data
Jan. 22, 2007 (JP) ................................. 2007-011707

(51) Int. Cl.
*F26B 11/02* (2006.01)

(52) U.S. Cl. .. 34/78; 34/58; 34/80; 34/235; 219/121.58; 438/509; 438/758; 427/444; 427/545; 162/375; 162/290; 118/58; 118/725

(58) Field of Classification Search ................ 34/58, 78, 34/80, 235; 427/444, 545; 162/375, 290; 118/58, 725; 219/121.58; 438/509, 758; 134/30, 111
See application file for complete search history.

(56) References Cited

U.S. PATENT DOCUMENTS

| | | | | |
|---|---|---|---|---|
| 3,618,919 A * | 11/1971 | Beck | | 432/237 |
| 3,872,603 A * | 3/1975 | Williams et al. | | 34/265 |
| 3,962,798 A * | 6/1976 | Jackson | | 34/340 |
| 4,127,947 A * | 12/1978 | Webb et al. | | 34/92 |
| 4,143,471 A * | 3/1979 | Wochnowski et al. | | 34/475 |
| 4,179,530 A * | 12/1979 | Koppl et al. | | 427/545 |
| 4,181,161 A * | 1/1980 | Kraus | | 141/8 |
| 4,186,684 A * | 2/1980 | Intrater et al. | | 118/725 |
| 4,202,113 A * | 5/1980 | Kankaanpaa | | 34/456 |
| 4,241,515 A * | 12/1980 | Wochnowski et al. | | 34/474 |
| 4,346,524 A * | 8/1982 | Wochnowski et al. | | 34/482 |
| 4,442,143 A * | 4/1984 | Reed | | 427/340 |
| 4,443,410 A * | 4/1984 | Zaferes | | 118/729 |
| 4,491,610 A * | 1/1985 | Mansour | | 427/337 |
| 4,492,041 A * | 1/1985 | Mansour | | 34/406 |
| 4,520,750 A * | 6/1985 | Mansour | | 118/58 |
| 4,546,553 A * | 10/1985 | Best | | 34/266 |
| 4,626,301 A * | 12/1986 | Nolte | | 156/99 |
| 4,651,674 A * | 3/1987 | Hayashi et al. | | 118/728 |
| 4,680,061 A * | 7/1987 | Lamont, Jr. | | 250/398 |

(Continued)

FOREIGN PATENT DOCUMENTS

DE  4034468 A1 * 5/1992

(Continued)

*Primary Examiner* — Stephen M. Gravini
(74) *Attorney, Agent, or Firm* — Smith, Gambrell & Russell, LLP

(57) ABSTRACT

A disclosed heating apparatus for heating a substrate on which a film is coated includes a process chamber having a gas supply opening for supplying a first gas to the process chamber and a gas evacuation opening for evacuating the first gas from the process chamber; a heating plate that is arranged in the process chamber and includes a heating element for heating the substrate; plural protrusions arranged on the heating plate so as to support the substrate; plural suction holes formed in the heating plate so as to attract by suction the substrate toward the heating plate; and a gas inlet adapted to supply a second gas to a gap between the heating plate and the substrate supported by the plural protrusions.

8 Claims, 12 Drawing Sheets

U.S. PATENT DOCUMENTS

| | | | | |
|---|---|---|---|---|
| 4,785,552 A * | 11/1988 | Best | | 34/418 |
| 4,816,081 A * | 3/1989 | Mehta et al. | | 134/30 |
| 4,823,480 A * | 4/1989 | Komatsuzaki | | 34/218 |
| 4,957,432 A * | 9/1990 | Rachal et al. | | 432/59 |
| 4,984,439 A * | 1/1991 | Smejda | | 68/5 C |
| 5,016,332 A * | 5/1991 | Reichelderfer et al. | | 29/25.01 |
| 5,022,419 A * | 6/1991 | Thompson et al. | | 134/102.1 |
| 5,090,898 A * | 2/1992 | Smith | | 431/326 |
| 5,095,927 A * | 3/1992 | Thompson et al. | | 134/102.1 |
| 5,127,168 A * | 7/1992 | Pikulik | | 34/423 |
| 5,154,199 A * | 10/1992 | Thompson et al. | | 134/111 |
| 5,167,078 A * | 12/1992 | Bolde et al. | | 34/444 |
| 5,192,370 A * | 3/1993 | Oda et al. | | 118/723 R |
| 5,216,820 A * | 6/1993 | Green et al. | | 34/273 |
| 5,221,360 A * | 6/1993 | Thompson et al. | | 134/33 |
| 5,244,556 A * | 9/1993 | Inoue | | 204/192.12 |
| 5,275,976 A * | 1/1994 | Moslehi | | 438/800 |
| 5,377,708 A * | 1/1995 | Bergman et al. | | 134/105 |
| 5,405,444 A * | 4/1995 | Moslehi | | 118/725 |
| 5,540,152 A * | 7/1996 | DeMoore | | 101/483 |
| 5,713,138 A * | 2/1998 | Rudd | | 34/274 |
| 5,715,610 A * | 2/1998 | Smith et al. | | 34/58 |
| 5,797,195 A * | 8/1998 | Huling et al. | | 34/404 |
| 5,830,321 A * | 11/1998 | Lindsay et al. | | 162/204 |
| 5,901,462 A * | 5/1999 | Rudd | | 34/274 |
| 5,950,328 A * | 9/1999 | Ichiko et al. | | 34/364 |
| 5,953,827 A * | 9/1999 | Or et al. | | 34/58 |
| 5,953,833 A * | 9/1999 | Rudd | | 34/528 |
| 6,063,197 A * | 5/2000 | Cox et al. | | 118/715 |
| 6,067,727 A * | 5/2000 | Muraoka | | 34/317 |
| 6,070,576 A * | 6/2000 | Banucci et al. | | 128/203.28 |
| 6,080,279 A * | 6/2000 | Hada et al. | | 162/290 |
| 6,093,284 A * | 7/2000 | Hada et al. | | 162/290 |
| 6,143,135 A * | 11/2000 | Hada et al. | | 162/290 |
| 6,192,603 B1* | 2/2001 | Seita | | 34/559 |
| 6,228,220 B1* | 5/2001 | Hada et al. | | 162/203 |
| 6,256,903 B1* | 7/2001 | Rudd | | 34/412 |
| 6,291,800 B1* | 9/2001 | Shirakawa et al. | | 219/390 |
| 6,306,257 B1* | 10/2001 | Hada et al. | | 162/290 |
| 6,380,518 B2* | 4/2002 | Shirakawa et al. | | 219/390 |
| 6,399,923 B2* | 6/2002 | Kano et al. | | 219/411 |
| 6,460,269 B2* | 10/2002 | Cho et al. | | 34/58 |
| 6,473,995 B2* | 11/2002 | Miyakawa et al. | | 34/403 |
| 6,566,199 B2* | 5/2003 | Tokai et al. | | 438/261 |
| 6,605,550 B2* | 8/2003 | Nagashima | | 438/758 |
| 6,646,278 B1* | 11/2003 | Schwarz et al. | | 250/504 R |
| 6,647,642 B2* | 11/2003 | Kamikawa et al. | | 34/490 |
| 6,656,838 B2* | 12/2003 | Watanabe et al. | | 438/680 |
| 6,673,155 B2* | 1/2004 | Nagashima | | 118/666 |
| 6,691,720 B2* | 2/2004 | Bergman et al. | | 134/155 |
| 6,783,630 B2* | 8/2004 | Shajii et al. | | 156/345.53 |
| 6,824,748 B2* | 11/2004 | Kaushal et al. | | 422/198 |
| 6,887,803 B2* | 5/2005 | Yoo | | 438/795 |
| 6,959,502 B2* | 11/2005 | Nakamura et al. | | 34/233 |
| 7,005,010 B2* | 2/2006 | Bergman et al. | | 134/2 |
| 7,107,701 B2* | 9/2006 | Takemura et al. | | 34/526 |
| 7,166,187 B2* | 1/2007 | Shajii et al. | | 156/345.53 |
| 7,311,810 B2* | 12/2007 | Mok et al. | | 204/242 |
| 7,343,695 B2* | 3/2008 | Miyakawa et al. | | 34/92 |
| 7,353,623 B2* | 4/2008 | Asuke | | 34/381 |
| 7,363,729 B2* | 4/2008 | Tanaka et al. | | 34/418 |
| 7,665,227 B2* | 2/2010 | Wright et al. | | 34/339 |
| 7,669,530 B2* | 3/2010 | Aylor et al. | | 101/424.1 |
| 7,745,079 B2* | 6/2010 | Coon | | 430/30 |
| 7,803,248 B2* | 9/2010 | Pinkham et al. | | 162/156 |
| 7,892,399 B2* | 2/2011 | Graham et al. | | 162/193 |
| 7,908,995 B2* | 3/2011 | Inamasu et al. | | 118/300 |
| 2001/0015019 A1* | 8/2001 | Miyakawa et al. | | 34/406 |
| 2001/0025428 A1* | 10/2001 | Cho et al. | | 34/58 |
| 2002/0000432 A1* | 1/2002 | Shirakawa et al. | | 219/390 |
| 2002/0004994 A1* | 1/2002 | Rudd | | 34/343 |
| 2002/0014700 A1* | 2/2002 | Tokai et al. | | 257/773 |
| 2002/0073576 A1* | 6/2002 | Kamikawa et al. | | 34/448 |
| 2002/0182131 A1* | 12/2002 | Kaushal et al. | | 422/198 |
| 2003/0015218 A1* | 1/2003 | Bran | | 134/1.3 |
| 2003/0019124 A1* | 1/2003 | Miyakawa et al. | | 34/92 |
| 2003/0056911 A1* | 3/2003 | Hermans et al. | | 162/101 |
| 2003/0070781 A1* | 4/2003 | Hermans et al. | | 162/115 |
| 2003/0116279 A1* | 6/2003 | Shim | | 156/345.33 |
| 2004/0139626 A1* | 7/2004 | Takemura et al. | | 34/448 |
| 2004/0216324 A1* | 11/2004 | Nakamura et al. | | 34/235 |
| 2005/0022418 A1* | 2/2005 | Rietmann | | 34/493 |
| 2005/0198857 A1* | 9/2005 | Nakazawa et al. | | 34/391 |
| 2006/0059708 A1* | 3/2006 | Kim et al. | | 34/351 |
| 2006/0137213 A1* | 6/2006 | Asuke | | 34/402 |
| 2006/0168839 A1* | 8/2006 | Lee et al. | | 34/92 |
| 2006/0213077 A1* | 9/2006 | Tanaka et al. | | 34/423 |
| 2006/0236559 A1* | 10/2006 | Mori | | 34/380 |
| 2006/0272174 A1* | 12/2006 | Hartig | | 34/475 |
| 2007/0175062 A1* | 8/2007 | Toshima et al. | | 34/410 |
| 2007/0209226 A1* | 9/2007 | Coon | | 34/403 |
| 2007/0227034 A1* | 10/2007 | Ogawa et al. | | 34/444 |
| 2008/0104861 A1* | 5/2008 | Yahiro | | 34/463 |
| 2008/0175999 A1* | 7/2008 | Kawaji et al. | | 427/444 |
| 2008/0289788 A1* | 11/2008 | Pinkham et al. | | 162/375 |
| 2009/0019722 A1* | 1/2009 | Nakazawa et al. | | 34/391 |
| 2009/0065486 A1* | 3/2009 | Yamashita | | 219/121.58 |
| 2009/0142933 A1* | 6/2009 | Yajima et al. | | 438/758 |
| 2009/0173444 A1* | 7/2009 | Sago et al. | | 156/345.33 |
| 2009/0205783 A1* | 8/2009 | Tanabe et al. | | 156/345.37 |
| 2009/0239362 A1* | 9/2009 | Hirata et al. | | 438/509 |
| 2009/0304886 A1* | 12/2009 | Greenfield | | 426/467 |
| 2009/0305612 A1* | 12/2009 | Miyazaki et al. | | 451/11 |
| 2010/0008656 A1* | 1/2010 | Sorabji et al. | | 392/416 |
| 2010/0043839 A1* | 2/2010 | Hamada et al. | | 134/30 |
| 2010/0215872 A1* | 8/2010 | Sivaramakrishnan et al. | | 427/585 |
| 2010/0263587 A1* | 10/2010 | Sivaramakrishnan et al. | | 117/94 |
| 2010/0325913 A1* | 12/2010 | Wang et al. | | 34/423 |

FOREIGN PATENT DOCUMENTS

| | | | |
|---|---|---|---|
| DE | 4412674 C1 * | 8/1995 | |
| DE | 19502865 A1 * | 8/1995 | |
| EP | 292090 A2 * | 11/1988 | |
| EP | 476652 A2 * | 3/1992 | |
| EP | 492632 A1 * | 7/1992 | |
| EP | 619381 A1 * | 10/1994 | |
| EP | 628644 A2 * | 12/1994 | |
| JP | 54103953 A * | 8/1979 | |
| JP | 55032022 A * | 3/1980 | |
| JP | 56013720 A * | 2/1981 | |
| JP | 57040964 A * | 3/1982 | |
| JP | 57124065 A * | 8/1982 | |
| JP | 57178328 A * | 11/1982 | |
| JP | 59040524 A * | 3/1984 | |
| JP | 59059495 A * | 4/1984 | |
| JP | 59099435 A * | 6/1984 | |
| JP | 59144121 A * | 8/1984 | |
| JP | 60010619 A * | 1/1985 | |
| JP | 60124926 A * | 7/1985 | |
| JP | 60236023 A * | 11/1985 | |
| JP | 60236024 A * | 11/1985 | |
| JP | 61047645 A * | 3/1986 | |
| JP | 61070730 A * | 4/1986 | |
| JP | 61071625 A * | 4/1986 | |
| JP | 61073324 A * | 4/1986 | |
| JP | 61132583 A * | 6/1986 | |
| JP | 61156724 A * | 7/1986 | |
| JP | 61216330 A * | 9/1986 | |
| JP | 62023003 A * | 1/1987 | |
| JP | 62035515 A * | 2/1987 | |
| JP | 62081020 A * | 4/1987 | |
| JP | 62131522 A * | 6/1987 | |
| JP | 62193141 A * | 8/1987 | |
| JP | 62230978 A * | 10/1987 | |
| JP | 62297233 A * | 12/1987 | |
| JP | 63084026 A * | 4/1988 | |
| JP | 63241923 A * | 10/1988 | |
| JP | 63300512 A * | 12/1988 | |
| JP | 01244615 A * | 9/1989 | |
| JP | 02187015 A * | 7/1990 | |
| JP | 02196416 A * | 8/1990 | |
| JP | 03062515 A * | 3/1991 | |
| JP | 03287772 A * | 12/1991 | |
| JP | 04074859 A * | 3/1992 | |
| JP | 04297021 A * | 10/1992 | |
| JP | 05021259 A * | 1/1993 | |

| | | | | | | | | |
|---|---|---|---|---|---|---|---|---|
| JP | 05251370 | A | * | 9/1993 | JP | 2004128195 A | * | 4/2004 |
| JP | 06112129 | A | * | 4/1994 | JP | 2006073590 A | * | 3/2006 |
| JP | 6-338450 | | | 12/1994 | JP | 2006114638 A | * | 4/2006 |
| JP | 07193003 | A | * | 7/1995 | JP | 2006-210400 | | 8/2006 |
| JP | 07201956 | A | * | 8/1995 | JP | 2007035754 A | * | 2/2007 |
| JP | 07326578 | A | * | 12/1995 | JP | 2007095923 A | * | 4/2007 |
| JP | 08102056 | A | * | 4/1996 | JP | 2007227470 A | * | 9/2007 |
| JP | 08268790 | A | * | 10/1996 | JP | 2009049067 A | * | 3/2009 |
| JP | 11092940 | A | * | 4/1999 | JP | 2009224765 A | * | 10/2009 |
| JP | 11145106 | A | * | 5/1999 | JP | 2010062194 A | * | 3/2010 |
| JP | 11233934 | A | * | 8/1999 | WO | WO 2007055381 A1 | * | 5/2007 |
| JP | 11354032 | A | * | 12/1999 | WO | WO 2008152940 A1 | * | 12/2008 |
| JP | 2000068260 | A | * | 3/2000 | | | | |
| JP | 2000331939 | A | * | 11/2000 | | | | |

* cited by examiner

HEATING APPARATUS, HEATING METHOD, AND COMPUTER READABLE STORAGE MEDIUM

BACKGROUND OF THE INVENTION

1. Field of the Invention

The present invention relates to a heating apparatus and a heating method, which are for heating a substrate on which a film is coated, and a computer readable storage medium storing a computer program for causing the heating apparatus to perform the heating method.

2. Description of the Related Art

A coater/developer for coating an organic material film such as a resist film or the like on a substrate and developing the film is provided with a heating apparatus for heating and/or cooling the substrate.

As an example of such a heating apparatus, a substrate heating apparatus 101 is described in reference to FIG. 1. In the substrate heating apparatus 101, a substrate 103 is placed on a heating plate 102 and heated by a heater 104 embedded in the heating plate 102. During heating the substrate 103, nitrogen is supplied toward the substrate 103 so as to purge volatile substances such as organic solvents from the organic film. While the nitrogen or the like is exhausted by an exhaust apparatus 110, the volatile substances are collected by a collection portion 105. In such a substrate heating apparatus 101, when the back surface of the substrate 103 directly contacts the top surface of the heating plate 102, particles may be attached on the back surface of the substrate 103. In order to avoid the particles being attached on the back surface, the heating plate 102 is provided with plural pins 108 and the substrate 103 is placed on the plural pins 108. In this configuration, the substrate 103 is heated through an air layer, which is generally referred to as a proximity gap, formed between the back surface of the substrate 103 and the top surface of the heating plate 102.

By the way, when a film, for example, a resist film is formed on the substrate 103, the stress between the film and the substrate 103 may warp the substrate 103. In order to uniformly heat the substrate 103 even in this situation, there is known a thermal processing technique in which the heating plate 102 is provided with plural suction conduits 106 through which the substrate 103 is attracted onto the heating plate 102 by a vacuum pump 107, which is often referred to as a vacuum chuck method, thereby maintaining the substrate 103 flat with respect to the heating plate 102. As stated above, since the atmosphere in the substrate heating apparatus 101 is contaminated with, for example, volatile substances and/or sublimated substances from the resist film or the like, when the substrate 103 is attracted through the suction conduits 106, such substances are evacuated into the suction conduits 106. The substances flowing through the suction conduits 106 when cooled are condensed on the inside walls of the suction conduits 106, thereby narrowing the inner diameters of the suction conduits 106, which impairs the suction performance. As a result, the substrate 103 may no longer be attracted and thus uniform thermal processing is impaired.

In addition, Patent Document 1 listed below discloses a technique that can substantially confine the air layer between the substrate and the heating plate so as to prevent air from flowing therebetween. However, this technique cannot be employed when the edge area of a back surface of the substrate is contaminated by a resist solution since the contaminated edge area contacts a top surface of the heat plate so as to produce particles from the resist.

Patent Document 1: Japanese Laid-Open Patent Publication No. H06-338450 (paragraph 0027)

The present invention has been made in view of the above and is directed to a technique that can prevent a suction force from being reduced by condensation/precipitation of volatile substances and/or sublimated substances onto the inside walls of suction conduits through which suction force the substrate is attracted onto the heating plate by suction, thereby improving in-substrate temperature uniformity and substrate-to-substrate temperature uniformity.

SUMMARY OF THE INVENTION

A first aspect of the present invention provides a heating apparatus for heating a substrate on which a film is coated, the apparatus including a process chamber having a gas supply opening for supplying a first gas to the process chamber, and a gas evacuation opening for evacuating the first gas from the process chamber; a heating plate that is arranged in the process chamber and includes a heating element for heating the substrate; plural protrusions arranged on the heating plate so as to support the substrate; plural suction holes formed in the heating plate so as to attract by suction the substrate toward the heating plate; and a gas inlet adapted to supply a second gas to a gap between the heating plate and the substrate supported by the plural protrusions.

A second aspect of the present invention provides a heating apparatus according to the first aspect, wherein the gas inlet is formed so as to be directed toward the gap.

A third aspect of the present invention provides a heating apparatus according to the second aspect, further including a ring member arranged so as to encircle the substrate to be supported by the plural protrusions, wherein a top surface of the ring member may provide a gas flow guiding surface for guiding the first gas outward in the process chamber, and wherein the gas inlet is formed on an inner circumferential surface of the ring member.

A fourth aspect of the present invention provides a heating apparatus according to the second or third aspect, wherein the ring member includes a heating element adapted to heat the substrate.

A fifth aspect of the present invention provides a heating apparatus according to any one of the first through fourth aspects, wherein the gas inlet is formed as one end of a gas supplying conduit and the other end of the gas supplying conduit is open to the atmosphere.

A sixth aspect of the present invention provides a heating apparatus according to any one of the first through fifth aspects, wherein the gas evacuation opening is located at an outer position relative to the gas inlet.

A seventh aspect of the present invention provides a heating apparatus according to the sixth aspect, wherein the gas evacuation opening is formed on an inner side wall of the process chamber.

An eighth aspect of the present invention provides a heating apparatus according to any one of the first through seventh aspects, wherein the gas inlet is formed in the heating plate so as to be located at an outer position relative to one of the plural suction holes and below the substrate when the substrate is supported by the plural protrusions.

A ninth aspect of the present invention provides a heating method for heating a substrate on which a film is coated, the method comprising steps of placing the substrate on plural protrusions arranged on a heating plate in a process chamber; attracting the wafer onto the plural protrusions by suction through plural suction holes formed in the heating plate; supplying a first gas to the process chamber; supplying a second gas to a gap between the heating plate and the substrate on the plural protrusions; and heating the substrate with the heating plate.

A tenth aspect of the present invention provides a heating method according to the ninth aspect, wherein the second gas is supplied from a gas inlet formed so as to be directed toward the gap, in the step of supplying the second gas to the gap.

An eleventh aspect of the present invention provides a heating method according to the tenth aspect, wherein the second gas is supplied to the gap from a gas inlet formed on an inner circumferential surface of a ring member arranged so as to encircle the substrate on the plural protrusions, in the step of supplying the second gas to the gap; and wherein the first gas is guided outward in the process chamber by a top surface of the ring member, in the step of supplying the first gas.

A twelfth aspect of the present invention provides a heating method according to the eleventh aspect, wherein the step of heating the substrate includes a step of heating the substrate using a heating element included in the ring member.

A thirteenth aspect of the present invention provides a heating method according to any one of the tenth through twelfth aspects, wherein the gas inlet is formed as one end of a gas supplying conduit and the other end of the gas supplying conduit is open to the atmosphere and the second gas is atmospheric gas.

A fourteenth aspect of the present invention provides a heating method according to any one of the tenth through thirteenth aspects, wherein the first gas is evacuated from an evacuation opening formed at an outer position of the gas inlet in the step of supplying the first gas.

A fifteenth aspect of the present invention provides a heating method according to the fourteenth aspect, wherein the evacuation opening is formed on a side wall of the process chamber.

A sixteenth aspect of the present invention provides a heating method according to any one of the ninth through fifteenth aspects, wherein the second gas is supplied from a gas inlet formed in the heating plate so as to be located at an outer position relative to one of the plural suction holes and below the substrate when the substrate is on the plural protrusions in the step of supplying the second gas to the gap.

A seventeenth aspect of the present invention provides a computer readable storage medium that stores a computer program for causing a heating apparatus for heating a substrate on which a film is coated to heat the substrate. This computer program comprises steps of placing the substrate on plural protrusions arranged on a heating plate in a process chamber; attracting the wafer onto the plural protrusions by suction through plural suction holes formed in the heating plate; supplying a first gas to the process chamber; supplying a second gas to a gap between the heating plate and the substrate on the plural protrusions; and heating the substrate by the heating plate.

According to the present invention, when the substrate on the plural protrusions is attracted toward the heating plate by suction through the suction holes, the second gas is supplied to the gap between the heating plate and the substrate. Therefore, the first gas, which flows above the substrate and may include the volatile substances and/or the sublimated substances, is prevented from flowing into the gap, thereby preventing the substances from being condensed/precipitated on the inside walls of the suction holes. As a result, a suction force through the suction holes is prevented from being reduced by condensation/precipitation of volatile substances and/or sublimated substances in the suction holes, thereby improving substrate-to-substrate temperature uniformity as well as in-substrate temperature uniformity.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENT

Figure 1:
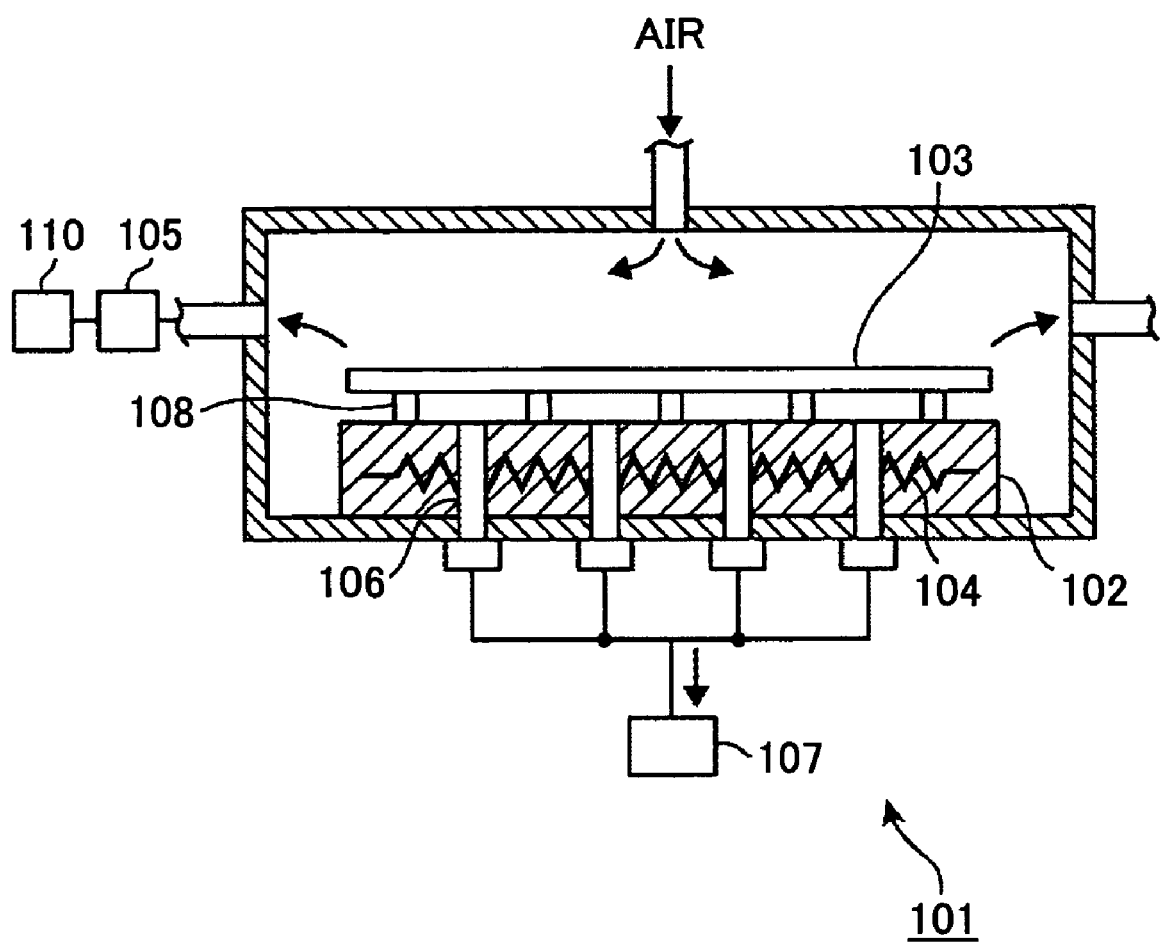
FIG. 1 is a cut-away elevational diagram of a related art heating apparatus.

Referring to the accompanying drawings, a heating apparatus according to exemplary embodiments of the present invention will be described. In the drawings, the same or corresponding reference marks are given to the same or corresponding members or components. It is to be noted that the drawings are illustrative of the invention, and there is no intention to indicate scale or relative proportions among the members or components. Therefore, the specific size should be determined by a person having ordinary skill in the art in view of the following non-limiting embodiments.

First Embodiment

A heating apparatus according to a first embodiment of the present invention is preferably applicable to a coater/developer that spin-coats a film such as a resist film or the like on a substrate, for example, a semiconductor wafer (simply referred to as wafer W, hereinafter) and develops the spin-coated film.

Figure 2:
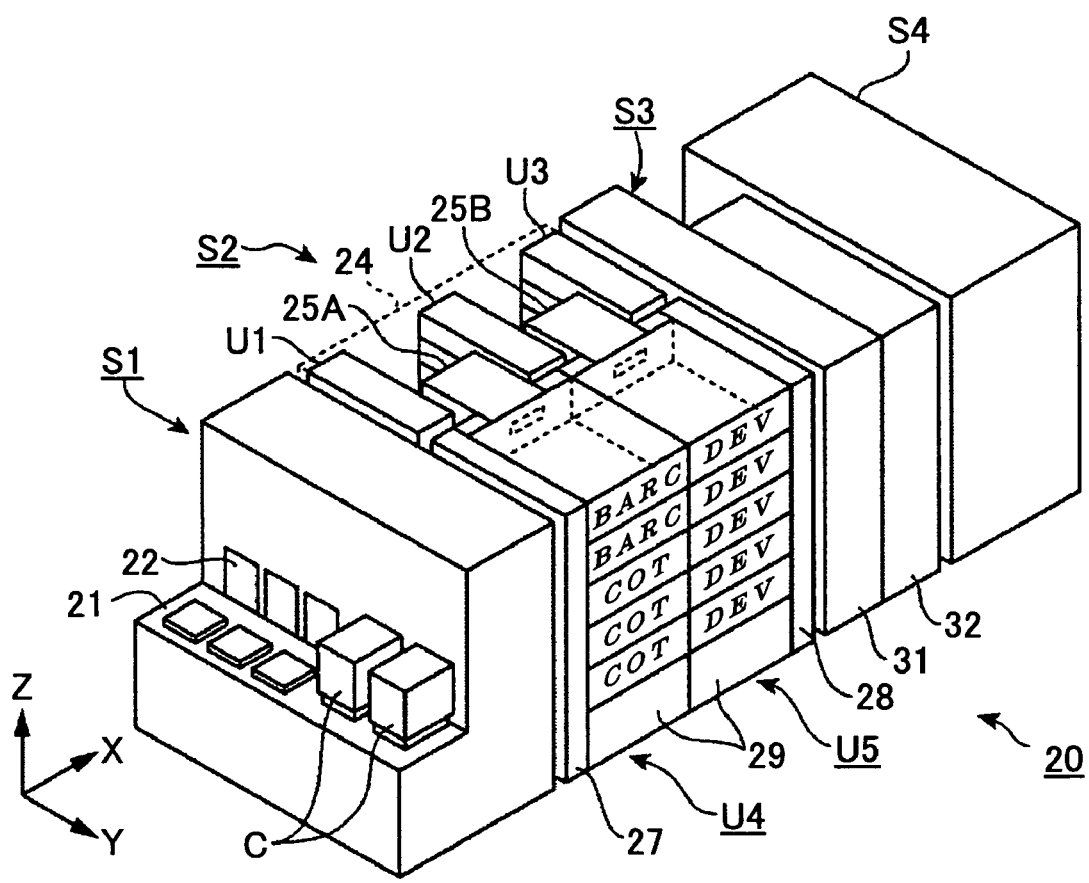
FIG. 2 is a perspective view of one example of a coater/developer to which a heating apparatus according to an embodiment of the present invention is preferably applied.
Figure 3:
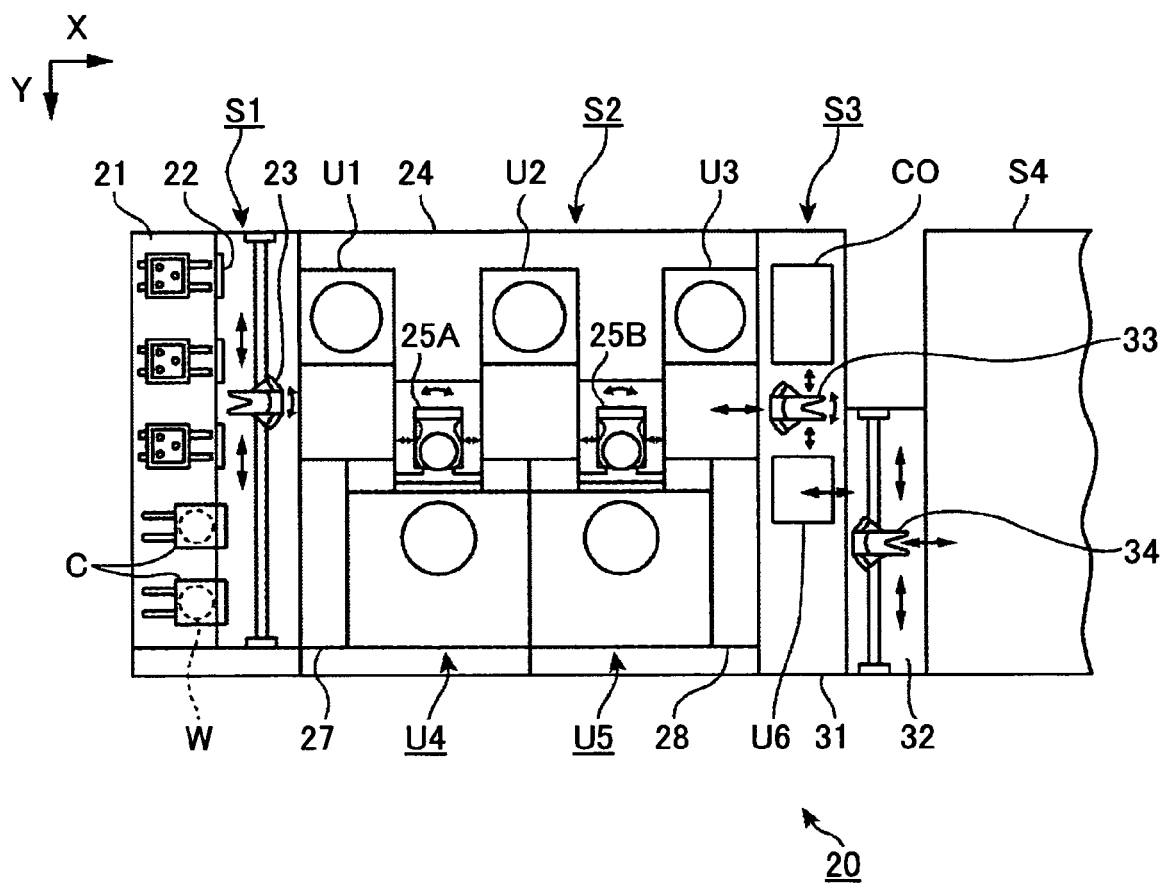
FIG. 3 is a plan view of the coater/developer shown in FIG. 2.

First, a coater/developer 20 is described in reference to FIGS. 2 and 3. As shown, the coater/developer 20 includes a cassette stage portion S1 for transferring wafers W (FIG. 4) in a substrate cassette C. The cassette stage portion S1 has a substrate cassette stage 21 on which plural substrate cassettes C can be placed, doors 22 corresponding to the plural substrate cassettes C placed on the substrate cassette stage 21, and a transfer mechanism 23 that transfers the wafers W from/to the substrate cassettes C through the doors 22. By the way, each of the substrate cassettes C can house plural wafers, for example, 13 wafers.

In addition, the coater/developer 20 includes a process portion S2 enclosed by a chassis 24 next to the cassette stage portion S1. As shown in FIG. 3, in the process portion S2, a shelf unit U1, a main transfer portion 25A, a shelf unit U2, a main transfer portion 25B, and a shelf unit U3 are arranged in this order from the front to the back of the process portion S2. In other words, the shelf units U1 through U3 and the main transfer portions 25A and 25B are arranged alternately along an X direction in FIG. 3 in the process portion S2.

Each of the shelf units U1 through U3 has multi-stage (e.g., 10-stage) heating and/or cooling units to be used to perform pre- and post-processes prior to liquid treatments performed in liquid treatment units U4, U5 (described below). In each of the multi-stage units U1 through U3 is included a heating apparatus 2 (described below).

In addition, the main transport portions 25A and 25B transport the wafer W between the shelf units U1 through U3 and various process units including coat/development units. The shelf units U1 through U3 and the main transfer portions 25A and 25B have openings (not shown) through which the wafer W can be transferred from the shelf unit U1 through the shelf unit U3 in the process portion S2.

The main transfer portion 25A is located so as to be surrounded by the shelf unit U1, a liquid treatment unit U4, and the shelf unit U2. Similarly, the main transfer portion 25B is located so as to be surrounded by the shelf unit U2, a liquid treatment unit U5, and the shelf unit U3. The liquid treatment units U4, U5 have a storage portion 29 which is allocated as a storage space for resist solution, developing solution, or the like, and multi-stage, for example, five-stage units including a coater unit COT, a developer unit DEV, an anti-reflection film forming unit BARC, and the like located on top of the storage portion 29 (FIG. 2). By the way, next to the liquid treatment unit U4 (U5) is provided a temperature/humidity control unit 27 (28) that includes a temperature controller for the solutions used in the liquid treatment unit U4 (U5), a duct to be used for controlling temperature and humidity, and the like.

Next to the process portion S2 along the positive X direction in FIGS. 2 and 3, an interface portion S3 is provided so that the process portion S2 is flanked by the cassette stage portion S1 and the interface portion S3. The interface portion S3 has a first transfer chamber 31 and a second transfer chamber 32. While one side of the second transfer chamber 32 is connected to the first transfer chamber 31, the other side of the second transfer chamber 32 is connected to an exposure portion S4 including an exposure apparatus. The interface portion S3 is provided with two transfer mechanisms 33, 34 for transferring the wafer W between the process portion S2 and the exposure portion S4, a shelf unit U6, and a buffer cassette C0.

In the above coater/developer 20, the wafer is processed in the following manner. First, the substrate cassette C housing the wafers W is placed on the substrate cassette stage 21. Next, a lid of the substrate cassette C is opened; the door 22 corresponding to this substrate cassette C is opened; and thus the wafer W is taken out by the transfer mechanism 23 from the substrate cassette C. Then, the wafer W is handed over to the main transfer portion 25A via a transfer unit (not shown) which is one of the stages in the shelf unit U1. In one of the stages in the shelf units U1 through U3, the wafer W undergoes a pre-treatment such as a hydrophobizing process, a cooling process, or the like and then a resist film is spin-coated on the treated wafer W in the coater unit COT. The coated wafer W is heated in the heating unit (heating apparatus 2), which is one of the stages in each of the shelf units U1 through U3, and then cooled. Next, the cooled wafer W is transferred into the interface portion S3 via a transfer unit of the shelf unit U3. In the interface portion S3, the wafer W is transferred from the transfer mechanism 33 to the exposure portion S4 via, for example, the shelf unit U6 and the transfer mechanism 34, and then the exposing process is performed on the wafer W in the exposure apparatus S4. After the exposure, the wafer W is transferred back to the shelf unit U3 along a route opposite to the route along which the wafer W is transferred from the shelf unit U3 to the exposure portion S4, and heated and cooled in the shelf unit U3. Then, the wafer W is transferred to one of the developing units DEV by the main transfer portion 25B, and the resist film on the wafer W is developed so that a resist mask is formed in the developing unit DEV. Finally, the wafer W is returned back to the original substrate cassette C on the substrate cassette stage 21.

Figure 4:
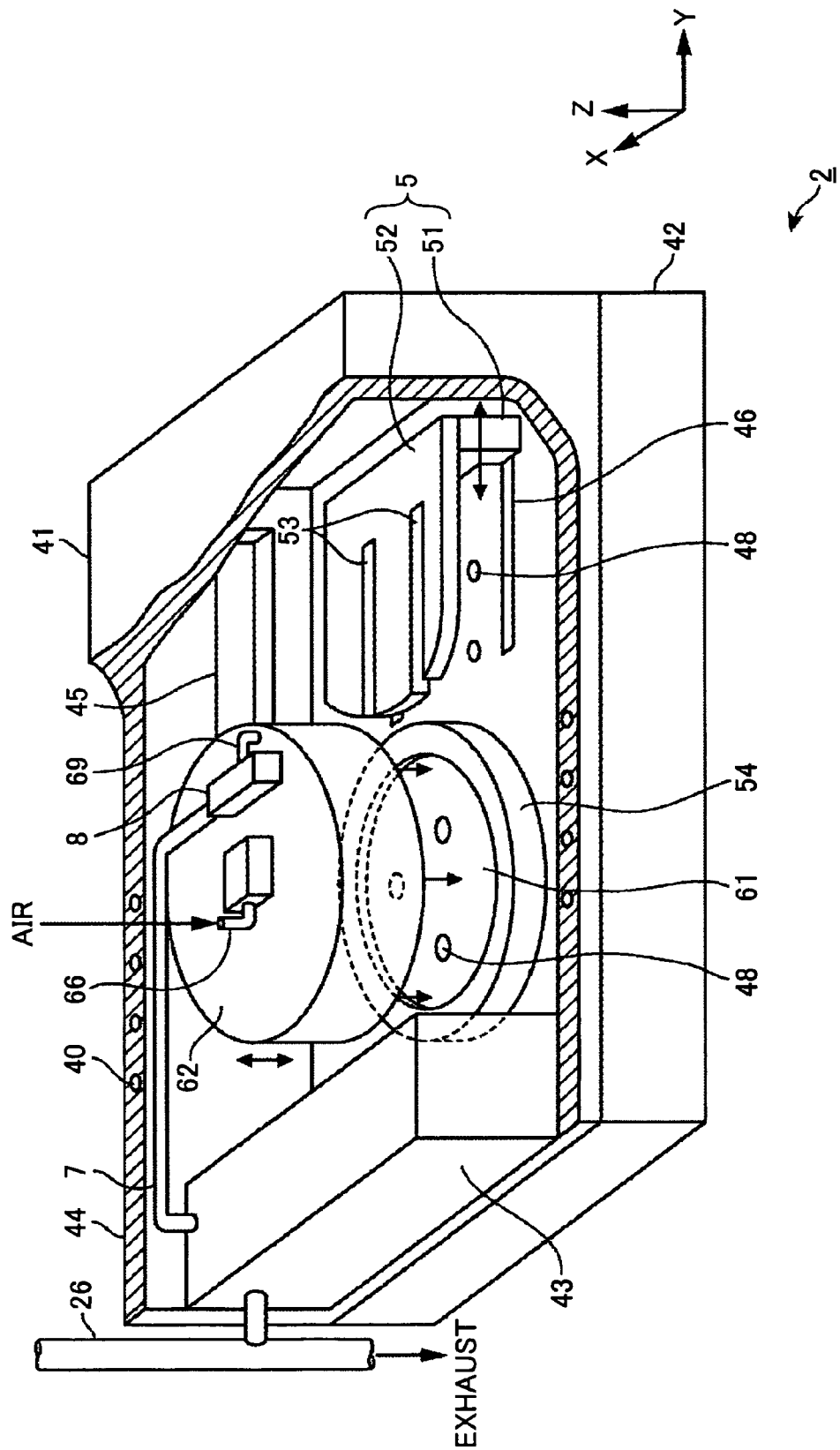
FIG. 4 is a perspective view of a heating apparatus according to a first embodiment of the present invention.
Figure 5:
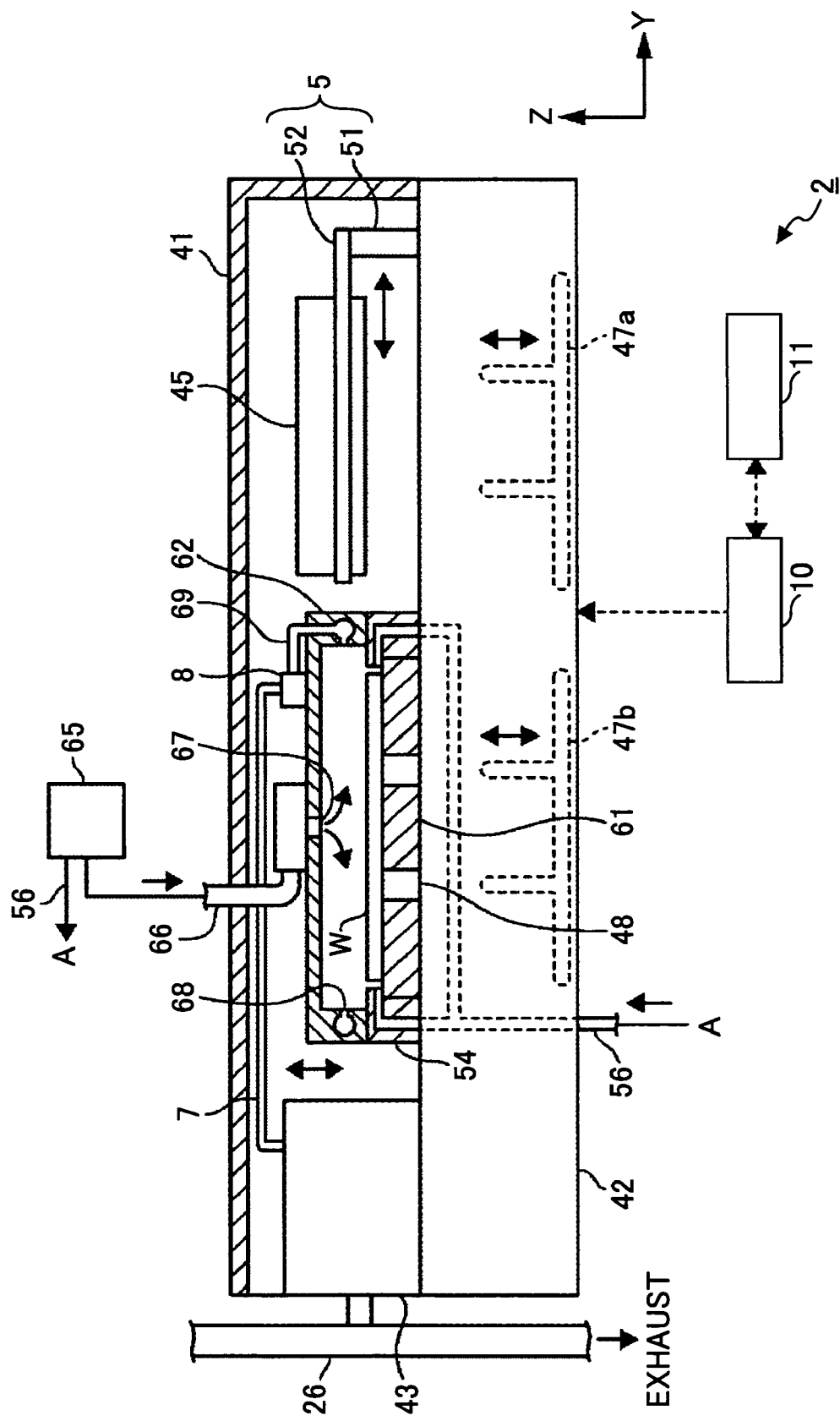
FIG. 5 is a cut-away elevational diagram of the heating apparatus shown in FIG. 4.
Figure 6:
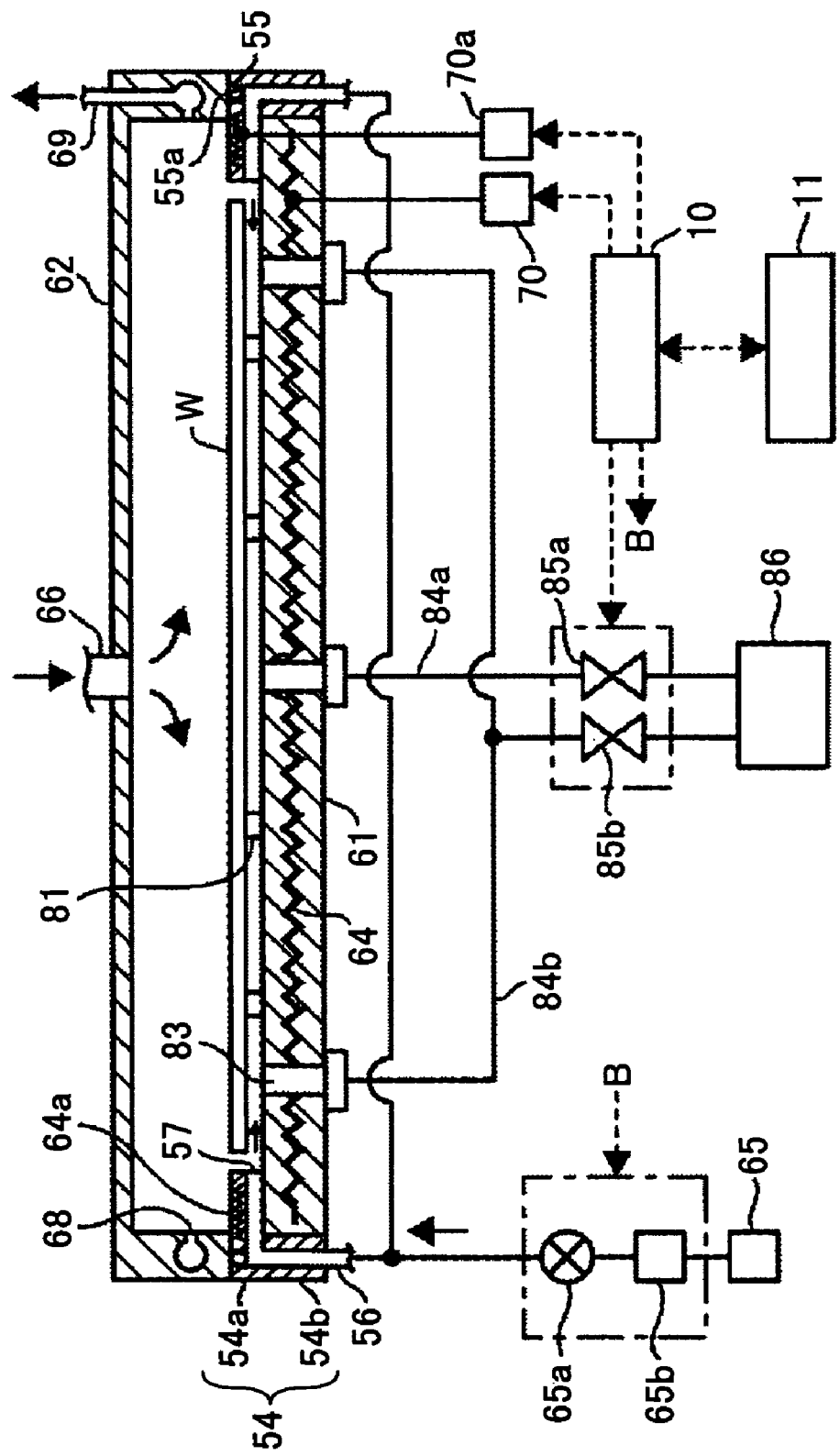
FIG. 6 is a cut-away elevational diagram of a heating plate of the heating apparatus shown in FIG. 4.

Next, a primary portion of the heating apparatus 2 according to the embodiment of the present invention is described in reference to FIGS. 4 through 6. The heating apparatus 2 is enclosed by a chassis 41 made of, for example, aluminum as shown in FIG. 4 and configured as one of the stages of each of the shelf units U1 through U3, as stated above. The chassis 41 is placed on a stage 42. Inside the chassis 41 there is a chamber 43 that houses members or components of an exhaust system at the farthest portion in a negative Y-direction (FIG. 4). In addition, in one of side walls 44 of the chassis 41 an opening 45 is formed through which the wafer W can be transferred into and out from the chassis 41. An openable/closable shutter (not shown) is provided for the opening 45. Moreover, plural coolant conduits 40 run in a vertical direction inside a center portion of the side wall 44. Through the coolant conduits 40, cooling water is supplied from a housing portion (not shown) located below the shelf unit U1 (U2, U3) so as to control the temperature inside the chassis 41.

On a top surface of the stage 42 there are arranged a heating plate 61 and a cooling arm 5 in this order along the positive Y direction in FIG. 4. The cooling arm 5 has a foot portion 51 movable along a guide 46 extending in the Y direction on the stage 42, and a wafer supporting plate 52 attached on the foot portion 51 so as to be substantially in parallel with the top surface of the stage 42. With this configuration, the cooling arm 5 can reciprocally move in the Y direction between a standby position, which is next to the opening 45, and a position above the heating plate 61. Therefore, the cooling arm 5 can receive the wafer W from the main transfer portion 25A (25B) that enters the chassis 41 through the opening 45 and position the wafer W above the heating plate 61. In addition, the wafer supporting plate 52 of the cooling arm 5 has on its back side a conduit (not shown) through which temperature controlling fluid such as purified water (deionized water) can flow, so that the wafer W is cooled to a temperature that can be readily handled by the heating plate 61.

In the stage 42 there are provided plural supporting pins 47a below the standby position of the wafer supporting plate 52 and plural supporting pins 47b below the heating plate 61 (FIG. 5). These supporting pins 47a, 47b are vertically movable so as to protrude upward from the top surface of the stage 42 via through holes 48 and recede below the top surface of the stage 42. In addition, the wafer supporting plate 52 of the cooling arm 5 has slits 53 so that the supporting pins 47a can protrude upward through the slits 53.

Next, peripheral members or components to the primary portion of the substrate processing apparatus 2 according to this embodiment of the present invention are described. Above the heating plate 61 there is provided a lid body 62 that is elevatable by an elevating mechanism (not shown). In addition, around the heating plate 61 is provided a ring member 54 (described later). The lid body 62 can be brought down so as to enclose the heating plate 61, as shown in FIG. 5, in an air-tight manner in cooperation with a sealing member 55a (FIG. 6) fitted into a groove 55 formed on the stage 42. The lid body 62, the ring member 54, and the heating plate 61 are constituent elements or members of a process chamber. By the way, the groove 55 and the sealing member 55a are omitted in FIGS. 4 and 5.

An opening 67 is formed at substantially the center of a ceiling of the lid body 62. A supplying pipe 66 is connected to the opening 67 and a purge gas supplying source 65 is connected to the supplying pipe 66. With such a configuration, gas such as air, nitrogen, or the like can be supplied from the gas supplying source 65 to the process chamber, specifically, toward the wafer W on the heating plate 61 through the supplying pipe 66. The gas supplying source 65 is also connected to the ring member 54 via a gas supplying conduit 56, as described below. In a side wall of the lid body 62 plural holes 68 are formed all along the inner wall of the lid body 62. These plural holes 68 are in communication with one end of an exhaust pipe 7 via an exhaust conduit 69 and a collection portion 8, which can exhaust the purge gas (air, nitrogen, or the like) supplied to the process chamber from the gas supplying source 65, the purge gas including the volatile substances and/or the sublimated substances from the wafer W. The collection portion 8 has, for example, a filter inside so as to collect the volatile substances and/or the sublimated substances. In addition, the other end of the exhaust pipe 7 is connected to an exhaust flow rate controlling member (not shown) in the housing chamber 43 and thus to a common exhaust line 26 that is shared by the shelf units U1, U2, U3.

Figure 7:
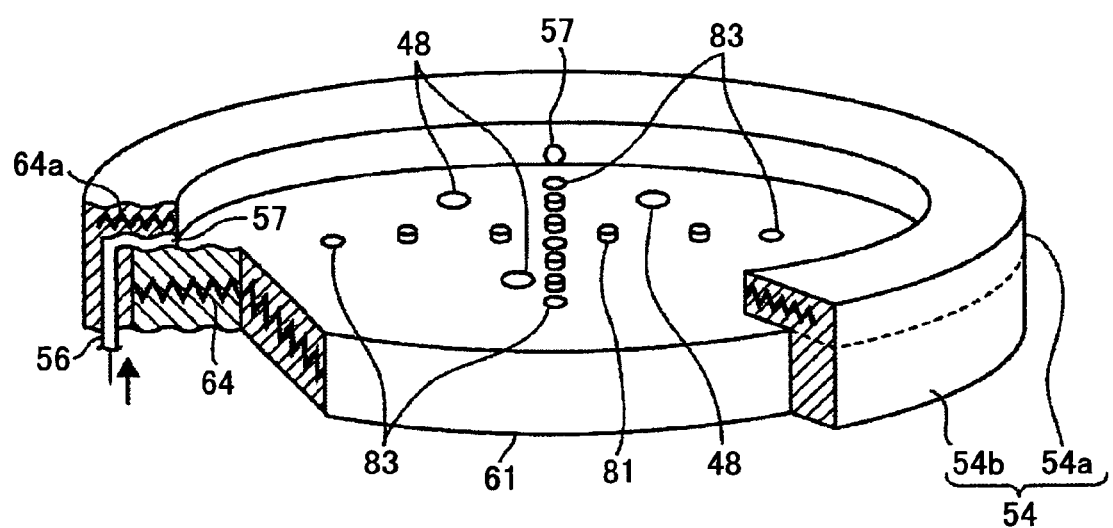
FIG. 7 is a perspective view of the heating plate shown in FIG. 6.

Next, the heating plate 61 is described in reference to FIGS. 6 and 7. The heating plate 61 is made of, for example, aluminum nitride and substantially shaped into a circular plate. Inside the heating plate 61 is embedded a heater 64 serving as a thermal exchange member for heating the wafer W. The heater 64 is electrically connected to a power supply 70. On the top surface of the heating plate 61 plural protrusions 81 are formed like pins so as to make a gap of about 0.1 mm between the wafer W and the heating plate 61. The protrusions 81 are distributed at substantially the same intervals on the top surface of the heating plate 61 so as to evenly support the wafer W on the heating plate 61 (protrusions 81). By the way, while two protrusions 81 are arranged along each of four radial directions from the center of the heating plate 61, or four protrusions 81 are arranged along each of two concentric circles (namely, a total of eight protrusions 81 are arranged) in FIG. 6, the number and/or arrangement of the protrusions 81 is not limited as shown. A larger number of the protrusions 81 may be arranged on the heating plate 61.

In addition, one suction hole 83 is formed in a position corresponding to the center of wafer W and four suction holes 83 are formed respectively in positions corresponding substantially to middle points along the radial directions between the center and the edge of the wafer W. The suction holes 83 are in communication with a suction apparatus 86 such as a vacuum pump via suction conduits 84a, 84b and valves 85a, 85b, so that the wafer W may be attracted from the center and the middle points of the wafer W toward the heating plate 61.

Since the wafer W can be held flat with respect to the heating plate 61 without touching the top surface of the heating plate 61 due to the protrusions 81 and the suction apparatus 86, the number of particles that may be attached to the back surface of the wafer W is reduced to a minimum level, and the wafer W is evenly heated. By the way, when the wafer W is attracted by suction onto the protrusions 81, the suction holes 83 are not closed because of the gap formed by the protrusions 81. Therefore, the suction holes 83 continue to evacuate the space behind the wafer W.

As clearly shown in FIG. 7, the ring member 54 is arranged so as to cover the circumferential portion of the top surface of and the side surface of the heating plate 61. The ring member 54 prevents the purge gas flowing above the top surface of the wafer W from flowing downward and around to below the back surface of the wafer W. As stated above, while, in the top surface side of the wafer W, the volatile substances and/or the sublimated substances evaporated from the wafer W by heat are evacuated along with the purge gas to the outside of the heating apparatus 2 through the holes 68, the gas between the wafer W and the heating plate 61 is suctioned from the suction holes 83 in order to attract the wafer W, in the back surface side of the wafer W. The ring member 54 may reduce the amount of the purge gas, which includes the volatile substances, flowing from the top surface side downward and around to the back surface side of the wafer W.

The ring member 54 is described in detail below. Although the ring member 54 is formed as a single member in the illustrated example, the ring member 54 is described as if this member were composed of an upper portion 54a and a lower portion 54b, which are virtually divided in the vertical direction at the level corresponding to the top surface of the heating plate 61, for convenience of the explanation.

On the inner circumferential surface of the upper portion 54a, for example, four gas supplying openings 57 are formed at equal angular intervals in the circumferential direction, as shown FIGS. 6 and 7. The gas supplying openings 57 serve as gas inlets to supply purified gas so that the purified gas from the gas supplying openings 57 is suctioned by the suction holes 83 thereby preventing the gas over the wafer W from flowing into the gap between the back surface of the wafer W and the heating plate 61. By the way, the purified gas may typically be nitrogen gas or filtered air, which is the same as the purge gas, but not limited to these as long as the purified gas contains no volatile substances and/or sublimated substances from the wafer W or a lesser amount of the volatile substances and/or sublimated substances from the wafer W than the purge gas flowing over the top surface of the wafer W.

In addition, the inner circumferential surface of the upper portion 54a is situated so as to leave a circumferential clearance of about 2.5 mm with respect to the edge of the wafer W placed on the heating plate 61 (protrusions 81) so as to prevent the purge gas flowing over the top surface of the wafer W from flowing downward and around to below the back surface of the wafer W. The top surface of the upper portion 54a is designed so as to be at the same level as the top surface of the wafer W placed on the heating plate 61 (protrusions 81). Namely, the top surface of the upper portion 54a serves as a gas flow guiding surface that guides the purge gas flowing over the wafer W outward to the holes 68. The top surface of the upper portion 54a virtually divides, along with the wafer W, the process chamber into an upper section, which is above the top surface of the wafer W, and a lower section, which is below the back surface of the wafer W.

The ring member 54 is preferably made of a highly heat-conductive material, for example but not limited to, ceramics including aluminum nitride (AlN) and silicon carbide (SiC), aluminum, or stainless steel for the purpose of reduced thermal influence on the wafer W and improved machining accuracy.

One end of the gas supplying conduit 56 is connected to the gas supplying opening 57, and the other end of the gas supplying conduit 56 is connected to the gas supplying source 65 via a valve 65a and a flow rate controller 65b. The flow rate of the purified gas that is supplied from the gas supplying openings 57 and flows between the back surface of the wafer W and the heating plate 61 is adjusted to be 50-150% of the gas flowing over the top surface of the wafer W. As stated above, the ring member 54 divides the process chamber into the upper and the lower sections so as to prevent the purge gas above the top surface of the wafer W from flowing downward and around to below the back surface of the wafer W. However, the purified gas supplied from the gas supplying openings 57 may flow up above the top surface of the wafer W, thereby adversely affecting the thermal process performed in the heating apparatus 2. Therefore, the flow rate of the purified gas from the gas supplying openings 57 is adjusted by the flow controller 65b under control of a controller 10 (described below) so that the gas flow from/to the upper section to/from the lower section can be prevented as much as possible. By the way, although the four gas supplying openings 57 are formed in the illustrated example, a larger number of the gas supplying openings 57, or only one gas supplying opening 57, may be formed.

The inner circumferential surface of the upper portion 54a, the surface being situated close to the edge of the wafer W, may be heated by a heater embedded in the heating plate 61 in order to reduce condensation/precipitation of the volatile substances and/or the sublimated substances on the surface of and heat transfer from the wafer W. In addition, the upper portion 54a contains a heater 64a that is connected to a power supply 70a so as to further prevent the condensation/precipitation and heat transfer.

Referring to FIGS. 5 and 6, the controller 10 is connected to the heating apparatus 2, which in turn is operated by the controller 10. The controller 10 may be a computer having a central processing unit (CPU), a storage unit (a memory device, a hard disk and the like), and a storage medium reader/writer and the like. A program causing the heating apparatus 2 to perform a heating process on the wafer W (described below) may be stored in a computer-readable medium 11 such as a portable hard disk, a CD-R, a CD-RW, DVD-R, DVD-RW, a magneto-optical disk, a memory card, a USB memory and the like, and installed into the storage unit of the controller 10.

In the heating apparatus 2 the wafer W is processed in the following manner. First, after the shutter (not shown) to the opening 45 is opened, the wafer W on which the resist film has been spin-coated in the coater unit COT is transferred into the chassis 41 through the opening 45 by the main transfer portion 25A (25B). When the wafer W is brought above the cooling arm 5, the supporting pins 47a are raised so as to receive the wafer W from the main transfer portion 25A (25B), the main transfer portion 25A (25B) is withdrawn from the chassis 41, and then the supporting pins 47a are lowered so as to place the wafer W on the wafer supporting plate 52 of the cooling arm 5. Next, the cooling arm 5 brings the wafer W above the heating plate 61 while the lid body 62 is kept higher above the heating plate 61. Then, the supporting pins 47b, which have been brought down below the heating plate 61, are raised so as to receive the wafer W. The cooling arm 5 goes back and then the supporting pins 47b are lowered so as to bring down the wafer W, which places the wafer W on the heating plate 61 (protrusions 81). At this time, the heater 64 is set at a predetermined temperature of, for example, 150° C. so as to heat the heating plate 61 at substantially the same temperature. After the wafer W is placed on the heating plate 61, the following procedure is carried out.

The lid body 62 is lowered so as to maintain airtightness around the wafer W, the heating plate 61, and the surrounding environment. Then, the purge gas such as nitrogen gas is supplied toward the top surface of the wafer W from the gas supplying source 65 via the gas supplying pipe 66 at a predetermined flow rate, and evacuated from the holes 68. With this, the ambient atmosphere inside the lid body 62 is purged. Then, the wafer W on the heating plate 61 (protrusions 81) is attracted toward the top surface of the heating plate 61 by the suction apparatus 86 through the suction holes 83 and the suction conduits 84a, 84b. As a result, the wafer W is kept flat with respect to the heating plate 61 and evenly thermally processed. Moreover, the purified gas such as filtered air is supplied from the gas supplying openings 57.

Figure 8:
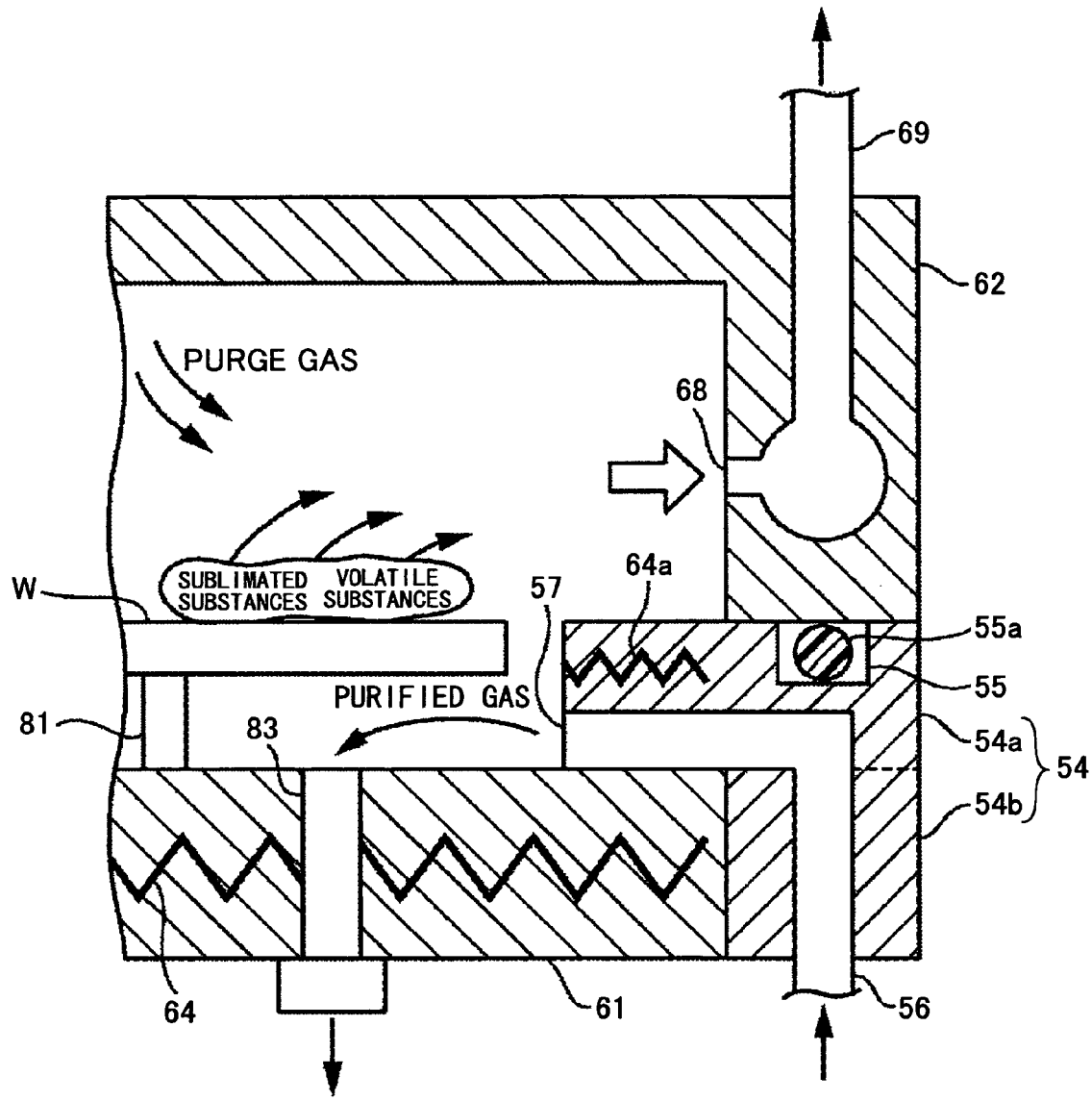
FIG. 8 is a cut-away diagram illustrating a gas flow pattern around the heating plate shown in FIG. 6.

As shown in FIG. 8, the volatile substances and/or the sublimated substances from the wafer W are evacuated out of the heating apparatus 2 through the holes 68 since the purge gas is guided outward by the top surface of the ring member 54 (the upper portion 54a). In addition, the amount of the gas suctioned through the suction holes 83 and the suction conduits 84a, 84b may be adjusted to be substantially the same as the amount of the purified gas supplied from the gas supplying openings 57, as long as the suction performance is not impaired. With this, the purge gas can be prevented from flowing below the wafer W. By the way, when the wafer W is thermally processed, the gas exhausted from the holes 68 is filtered by the collection portion 8 so that the volatile substances and/or the sublimated substances contained in the exhausted gas are collected by the collection portion 8, and the gas excluding such substances is exhausted by the common exhaust line 26.

When a predetermined period of time, for example, about 60 seconds has elapsed while the wafer W is kept flat on the heating plate 61 (protrusions 81), the wafer W is transferred back to the cooling arm 5 and then is transferred out of the chassis 41 by the main transfer portion 25A (25B) in the opposite manner compared to when the wafer W is transferred in.

Then, the subsequent wafers W are transferred into the chassis 41 one by one and the above procedures are repeated on each of the wafers W.

According to the first embodiment of the present invention, since the purified gas is supplied to the gap between the back surface of the wafer W and the heating plate 61, the purge gas including the volatile substances and/or sublimated substances from the wafer W is prevented from flowing into the gap, thereby preventing condensation/precipitation of such substances in the suction holes 83. Therefore, the suction performance can be stabilized for an extended period of time and thus wafer-to-wafer repeatability in the thermal process is improved.

In addition, since the inner circumferential surface of the ring member 54 comes close to the edge of the wafer W when the wafer W is placed on the heating plate 61 (protrusions 81), the upper section and the lower section, which are virtually divided by the top surfaces of the ring member 54 (the upper portion 54a) and the wafer W, are substantially not in communication with each other. Therefore, it is difficult for the purge gas above the wafer W to flow into the gap between the back surface of the wafer W and the heating plate 61, which can prevent the volatile substances and/or sublimated substances from being condensed in the suction holes 83. In addition, when the flow rate of the purified gas supplied to the gap is controlled to be substantially the same as the amount of gas suctioned by the suction apparatus 86 via the suction holes 83 and the suction conduits 84a, 84b, the purge gas is further prevented from flowing into the gap. Moreover, since the purified gas can be prevented from flowing up above the wafer W because of the ring member 54 and the controlled flow rate into the gap, the thermal process can be performed stably.

Furthermore, since the ring member 54 is heated by the heater 64 in the heating plate 61 and the heater 64a in the ring member 54 (upper portion 54a), the volatile substances and/or the sublimated substances from the wafer W can be prevented from being condensed/precipitated on the ring member 54. In addition, since the heated ring member 54 can in turn heat the wafer W, the temperature uniformity over the wafer W can be further improved.

Second Embodiment

Figure 9:
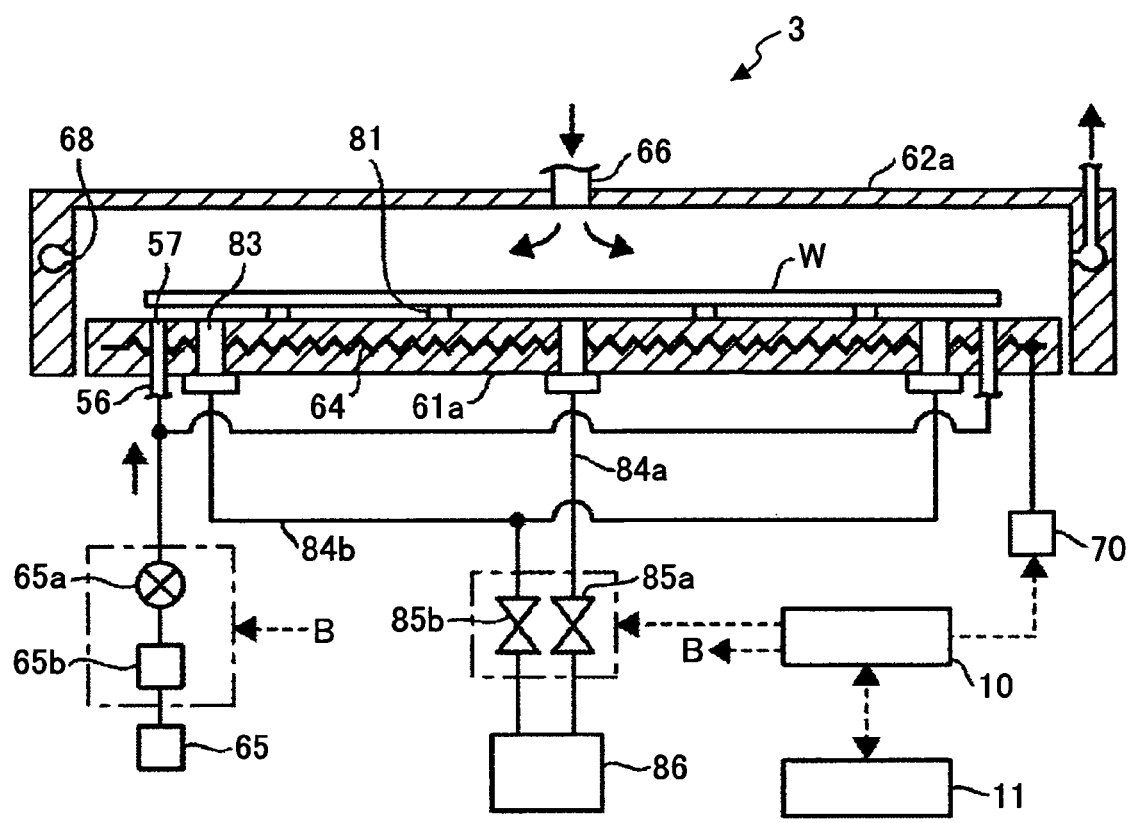
FIG. 9 is a cut-away diagram of a heating apparatus according to a second embodiment of the present invention.
Figure 10:
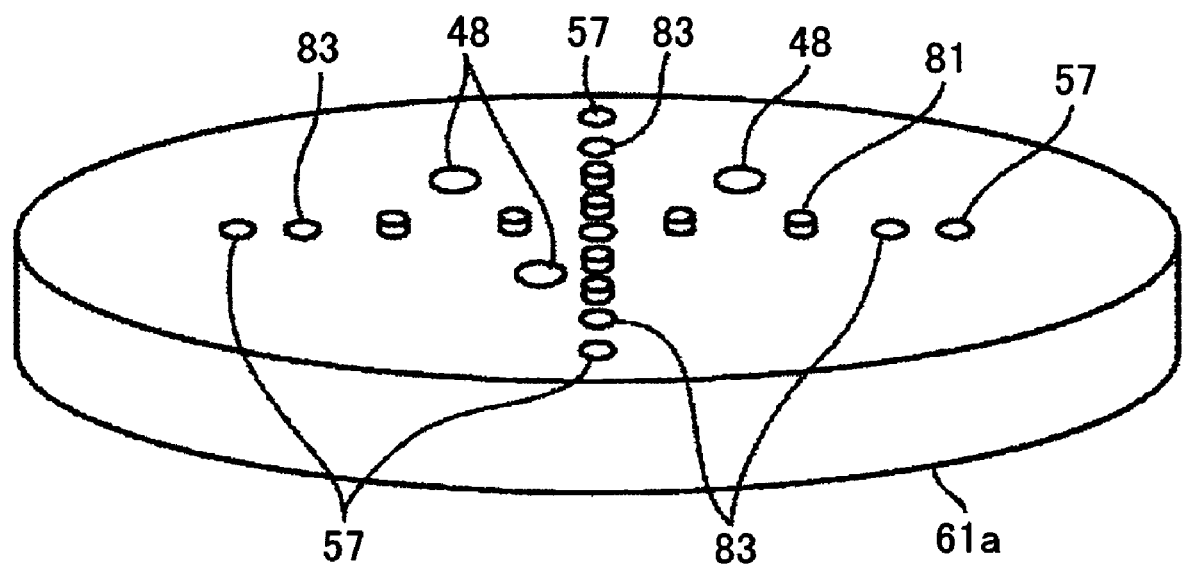
FIG. 10 is a perspective view of a heating plate of the heating apparatus according to the second embodiment.
Figure 11:
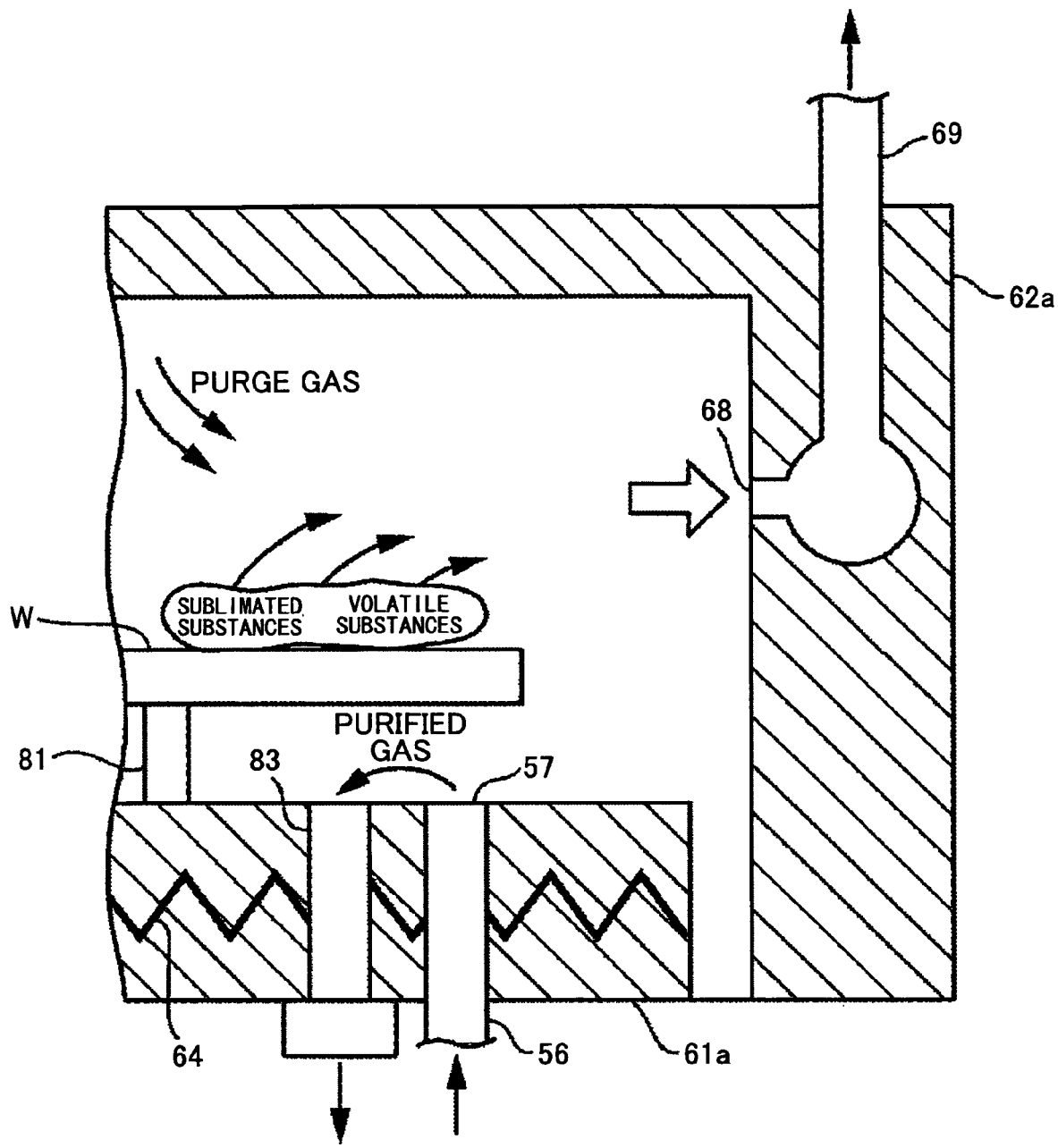
FIG. 11 is a cut-away diagram illustrating a gas flow pattern around the heating plate shown in FIG. 9.

Next, a heating apparatus according to a second embodiment of the present invention is explained in reference to FIGS. 9 and 10. The explanation below is focused on the difference between the heating apparatus according to the second embodiment and the heating apparatus 2 according to the first embodiment, specifically the difference in the heating plate and the lid body, while repetitive explanations about the same members or components as these in the first embodiment are omitted.

Referring to FIG. 9, a heating apparatus 3 according to the second embodiment does not include a ring member, which exists as the ring member 54 in the heating apparatus 2 according to the first embodiment. Because of lacking the ring member, the gas supplying openings 57, which are provided in the ring member 54 in the first embodiment, are formed in a heating plate 61a. In addition, the gas supplying openings 57 are arranged so as to be along the circumferential back portion of the wafer W to be placed on the protrusions 81 and at outward vicinities of the suction holes 83, as shown in FIG. 10. As stated above, since there is no ring member in the heating apparatus 3, the process chamber is not divided into the upper section and the lower section and thus the purge gas is not guided outward. Therefore, it might be assumed that the purge gas cannot be prevented from flowing into the gap between the back surface of the wafer W and the heating plate 61a. However, since the gas supplying openings 57 are positioned as stated above, the amount of purge gas to be suctioned by the suction holes 83 can be reduced.

A lid body 62a in the heating apparatus 3 is extended in the vertical direction compared to the lid body 62 in the heating apparatus 2 and directly sits on the stage 42. Although omitted in FIG. 9, the stage 42 has a groove in a portion that contacts the lid body 62a, and a sealing member fitted in the groove.

Even in this embodiment, the wafer W is attracted by suction toward the heating plate 61a. Since the purified gas supplied from the gas supplying openings 57 through the gas supplying conduits 56 is adjusted so as to prevent the gas above and the gas below the wafer W from mixing with each other as much as possible, the volatile substances and/or the sublimated substances can be prevented from being condensed on the suction holes 83, thereby allowing the wafer W to be uniformly thermally processed.

Modification Example

Figure 12:
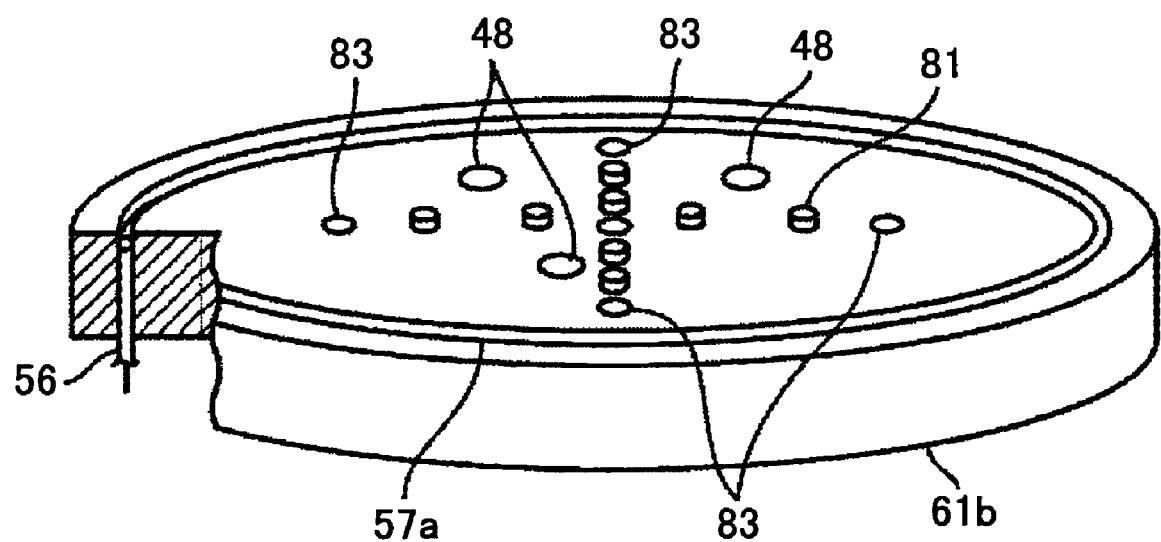
FIG. 12 is a perspective view of another heating plate as a modification example.

The gas supplying opening 57 formed in the heating plate 61a may be shaped into an annular groove, which is described in reference to FIG. 12. As shown, a heating plate 61b has a ring shaped gas supplying opening 57a outside the suction holes 83 and the gas supplying opening 57a is connected at a portion of the bottom to the gas supplying conduit 56. Although only one gas supplying conduit 56 is connected to the bottom of the gas supplying opening 57a in FIG. 12, plural gas supplying conduits 56 may be connected to corresponding positions of the bottom of the gas supplying opening 57a at equal angular intervals.

In such a heating plate 61b, the wafer W is attracted by suction and thermally processed in the same manner as performed with the heating plate 61a.

In the above embodiments and the example, the purified gas is supplied to the gap between the back surface of the wafer W and the heating plate 61, 61a, 61b along substantially converging radial directions, i.e., from the circumferential edge portion to the center of the heating plate 61, 61a, 61b. However, the purified gas may be supplied so as to traverse the heating plate 61, 61a, 61b in one direction by arranging the gas supplying openings 57 in an unevenly distributed manner in the ring member 54 or on the heating plate 61a, 61b. In addition, although the purified gas is intentionally supplied from the gas supplying source 65 in the above embodiments and the example, the gas supplying source 65 is not always necessary. For example, one end of the gas supplying conduits 56, which is opposite to the gas supplying opening 57, may be open to the atmosphere at a predetermined position, for example, outside the heating apparatus 2, 3 or the coater/developer 20. In this case, the purified air in a fabrication plant can be supplied to the gap between the back surface of the wafer W and the heating plate 61, 61a, 61b and suctioned from the suction holes 83.

Although the present invention has been described in conjunction with the foregoing specific embodiments, the present invention is not limited to the embodiments specifically disclosed herein, but various alterations and modifications may be applied without departing from the scope of the invention set forth in accompanying claims.

The present application contains subject matter related to Japanese Patent Application No. 2007-011707 filed with the Japanese Patent Office on Jan. 22, 2007, the entire contents of which are incorporated herein by reference.

What is claimed is:

1. A heating apparatus for heating a substrate on which a film is coated, the apparatus comprising:
a process chamber having a gas supply opening for supplying a first gas to the process chamber, and a gas evacuation opening for evacuating the first gas from the process chamber;
a heating plate that is arranged in the process chamber and includes a heating element for heating the substrate;
plural pin-like protrusions arranged on the heating plate so as to support the substrate and create a gap between the substrate and the heating plate;
plural suction holes formed in the heating plate so as to attract by suction the substrate toward the heating plate and the protrusions; and
a gas inlet adapted to supply a second gas to the gap between the heating plate and the substrate supported by the plural protrusions.

2. The heating apparatus of claim 1,
wherein the gas inlet is formed so as to be directed toward the gap.

3. The heating apparatus of claim 2, further comprising:
a ring member arranged so as to encircle the substrate supported by the plural protrusions, wherein a top surface of the ring member may provide a gas flow guiding surface for guiding the first gas outward in the process chamber, and wherein the gas inlet is formed on an inner circumferential surface of the ring member.

4. The heating apparatus of claim 3,
wherein the ring member includes a heating element adapted to heat the substrate.

5. The heating apparatus of claim 1,
wherein the gas inlet is formed as one end of a gas supplying conduit and the other end of the gas supplying conduit is open to atmosphere.

6. The heating apparatus of claim 1,
wherein the gas evacuation opening is located at an outer position relative to the gas inlet.

7. The heating apparatus of claim 6,
wherein the gas evacuation opening is formed on an inner side wall of the process chamber.

8. The heating apparatus of claim 1,
wherein the gas inlet is formed in the heating plate so as to be located at an outer position relative to one of the plural suction holes and below the substrate when the substrate is supported by the plural protrusions.

* * * * *